United States Patent
Van Brakel et al.

(10) Patent No.: US 11,086,217 B2
(45) Date of Patent: Aug. 10, 2021

(54) PATTERNED STAMP MANUFACTURING METHOD, PATTERNED STAMP AND IMPRINTING METHOD

(71) Applicant: KONINKLIJKE PHILIPS N.V., Eindhoven (NL)

(72) Inventors: Remco Van Brakel, Breda (NL); Marcus Antonius Verschuuren, Berkel-Enschot (NL)

(73) Assignee: Koninklijke Philips N.V., Eindhoven (NL)

( * ) Notice: Subject to any disclaimer, the term of this patent is extended or adjusted under 35 U.S.C. 154(b) by 861 days.

(21) Appl. No.: 15/538,354

(22) PCT Filed: Dec. 9, 2015

(86) PCT No.: PCT/EP2015/079048
§ 371 (c)(1),
(2) Date: Jun. 21, 2017

(87) PCT Pub. No.: WO2016/102185
PCT Pub. Date: Jun. 30, 2016

(65) Prior Publication Data
US 2018/0004084 A1   Jan. 4, 2018

(30) Foreign Application Priority Data

Dec. 22, 2014   (EP) ..................... 14199595

(51) Int. Cl.
G03F 7/00   (2006.01)
G03F 7/20   (2006.01)
(Continued)

(52) U.S. Cl.
CPC .......... *G03F 7/0002* (2013.01); *G03F 7/2012* (2013.01); *G03F 7/70241* (2013.01);
(Continued)

(58) Field of Classification Search
CPC .. G03F 7/0002; G03F 7/2012; G03F 7/70241; H01L 21/0274; Y10T 428/249978
See application file for complete search history.

(56) References Cited

U.S. PATENT DOCUMENTS

7,906,058 B2   3/2011   Ganapathisubramanian
9,323,144 B2   4/2016   Kreindl et al.
(Continued)

FOREIGN PATENT DOCUMENTS

JP   H06198832   7/1994
JP   2006007567   1/2006
(Continued)

OTHER PUBLICATIONS

Bahador Farshchian et al., "Soft UV-Nanoimprint Lithography on Non-Planar Surfaces", Microelectronic Engineering, Elsevier Publishers BV., Amsterdam, NL, vol. 88, No. 11, Jul. 20, 2011 (Jul. 20, 2011), pp. 3287-3292, XP028109521.
(Continued)

*Primary Examiner* — Joseph S Del Sole
*Assistant Examiner* — John Robitaille (57) ABSTRACT

A method of manufacturing a patterned stamp (100) for patterning a contoured surface (10) is disclosed. The method comprises applying a layer (115) of a pliable material precursor over a master (50) carrying an inverse pattern (52) to form a desired pattern (112) in said layer; curing the pliable material precursor to form a pliable stamp layer (120) comprising said desired pattern; providing an intermediate stamp structure by adhering a porous pliable support layer (130) to the pliable stamp layer; releasing the intermediate stamp structure from the master; forcing the intermediate stamp structure onto the contoured surface with said pattern of features facing the contoured surface; forming the patterned stamp by filling the porous pliable support layer with a filler material to reduce the pliability of the
(Continued)

support layer; and removing the patterned stamp from the contoured surface. A corresponding patterned stamp, imprinting method and imprinted article are also disclosed.

6 Claims, 7 Drawing Sheets (51) Int. Cl.
H01L 21/027 (2006.01)
G03F 7/004 (2006.01)
G03F 7/11 (2006.01)

(52) U.S. Cl.
CPC ........ *H01L 21/0274* (2013.01); *G03F 7/0046* (2013.01); *G03F 7/11* (2013.01)

(56) References Cited

U.S. PATENT DOCUMENTS

| 2008/0011834 | A1 | 1/2008 | Verschuuren |
| 2008/0271625 | A1 | 11/2008 | Chauhan |
| 2010/0034911 | A1 | 2/2010 | Mori |
| 2010/0109203 | A1 | 5/2010 | Chen |
| 2014/0020584 | A1 | 1/2014 | Abe |
| 2014/0091488 | A1 | 4/2014 | Ozaki |

FOREIGN PATENT DOCUMENTS

| JP | 2009080434 A | 4/2009 |
| JP | 2009517882 A | 4/2009 |
| JP | 2010030057 A | 2/2010 |
| JP | 2013064836 A | 4/2013 |
| JP | 203210504 A | 10/2013 |
| WO | WO2006042560 A1 | 4/2006 |
| WO | WO2009147602 A2 | 12/2009 |
| WO | WO2015011110 A1 | 1/2015 |

OTHER PUBLICATIONS

Choi, S-J et al., "A Polydimethylsiloxane (PDMS) Sponge for the Selective Absorption of Oil fro Water", ACS Applied MAterials & Interfaces, 2011, dx.doi.org/10.1021/am201352w.

Lee N Y et al., Novel Poly(dimethylsiloxane) Bonding Strategy via Room Temperature "Chemical Gluing", Langmuir 2009, vol. 25, pp. 3861-3866.

International Search Report and Written Opinion From PCT/EP2015/079048 dated Feb. 23, 2016.

PATTERNED STAMP MANUFACTURING METHOD, PATTERNED STAMP AND IMPRINTING METHOD

FIELD OF THE INVENTION

The invention relates to a method of manufacturing a printing stamp for patterning a contoured surface, the printing stamp per se and the use of the printing stamp for printing.

BACKGROUND OF THE INVENTION

Imprint lithography is a technique in which a patterned layer such as a masking layer is formed on a substrate such as a semiconductor substrate or as an optical layer by the deposition of a curable imprintable medium. The curable imprintable medium is subsequently patterned by imprinting the medium with a patterned stamp, after which the curable imprintable medium is solidified e.g. when exposed to light, e.g. UV-light to initiate the curing reaction in the medium. After the curing reaction is completed, the stamp is removed from the medium to leave a patterned layer, e.g. on the semiconductor substrate or on a carrier of such an optical layer. An example of a pliable stamp is disclosed in US 2008/0011934 A1.

This imprint technique can provide a significant cost reduction over traditional lithography process steps. It can be used for forming nanoscale patterns on so-called 2.5D surfaces, i.e. contoured surfaces, which for instance may comprise one or more protrusions, e.g. curved protrusions, emanating from a mainly planar surface. Such techniques may be used to pattern photo-voltaic solar cells, nanowires, VCSEL lasers, medical implants and so on, e.g. by creating nanoscale patterns on optical elements, e.g. lenses or on medical implants, e.g. to stimulate bone or tissue regeneration. To this end, a planar pliable patterned stamp, such as a polysiloxane-based rubber-like stamp, is typically deformed onto the contoured surface such that the stamp pattern is brought into contact with the contoured surface to be patterned.

SUMMARY OF THE INVENTION

A practical problem recognised by the inventors is that it is far from trivial to transfer a pattern from a flexible stamp to such a contoured surface. This becomes more difficult as the curvature of such contoured surface increases. In particular, it is difficult to bring the stamp into contact with a region of sharp bending or a boundary region between a planar section and a (curved) protrusion such that such regions can suffer from incomplete or even absent pattern features. This is because it is far from trivial to deform the pliable stamp to such an extent that it exactly matches the contoured surface. In addition, the high pressures required to force the stamp into these boundary regions reduces the lifetime of the stamp or spoils the faithful replication of the fine featured patterns in these or other regions.

It is an object of the invention to at least partially solve the aforementioned problem. This object is at least partially met with the invention which is defined by the independent claims. The dependent claims provide advantageous embodiments.

The invention provides a patterned stamp for imprint lithography for patterning of a contoured surface, a method of manufacturing such patterned stamp and the use of such stamp for patterning a contoured surface in a more accurate manner.

A contoured surface is a surface comprising at least one contour (non flat area) when the surface is in its relaxed state, i.e. when it is not actively bent or stressed. Thus, for example, the pliable stamp layer comprises a countoured surface when the printing stamp is in its relaxed state, i.e. is not bent or stressed in any way. A contour can be a protrusion extending from or a depression receding from a main surface (e.g. the main surface in the plane of the printing stamp). Such protursions or depressions can e.g. be trapezoidaly or pyramidically shaped with one or more straight or curved surfaces. Protrusions or depressions can also be in the form of a half sphere or cylinder or other rounded shape. A contoured surface does not necessarily mean that the main surface is substantially flat with protrusions, but can also mean that the main surface is continuously curved e.g. as in the shape of a half sphere or cylinder or other rounded protrusions or depressions. In that case such surfaces can also still have one or more protrusions and depressions, possibly distributed over the main surface.

The stamp may be obtained by the stamp manufacturing method and therewith provides an improved fit, in particular with respect to X-Y (in plane of major stamp surface) and Z dimensions (vertical to major stamp surface) as well as position with a contoured surface to be patterned. The use of the stamp for patterning can therefore provide printing of contoured surfaces of choice with improved accuracy.

In particular, the manufacture of the stamp of the invention does not require a difficult to make master with a relief pattern on its contoured surface already present. Instead, with the invention, a substantially flat stamp layer can be provided with a relief pattern of choice, which stamp layer can then be supported by a porous, and therewith pliable and/or compressible, support layer for handling the often fragile pliable stamp layer. This configuration allows to apply the stamp layer with its pattern area around the non-patterned contoured surface of a substrate of choice in a conformal manner (thereby at least partly plying and/or compressing the stamp layer). In this state the support layer can be fixed to be more rigid (reduce its pliability and/or compressibility) in order that it retains its contoured shape. Removal of the substrate leaves a contoured stamp that can be used to provide a pattern to any substrate that was used as its shape master.

The printing stamp of the invention comprising a pliable stamp layer having a contoured surface (120) carrying a relief pattern (122) that is exposed for patterning of a contoured surface of a substrate and a support layer adhered to the pliable stamp layer and comprising a plurality of pores filled with a filler material.

Printing may be microcontact printing, but preferably is imprinting. With microcontact printing the protruding parts of the relief pattern are used to transfer some kind of ink to the surface of the substrate. With imprinting, the relief pattern of the stamp are applied to an imprintable layer or imprint ink (also referred to as imprint resist) so that this layer adopts a relief pattern that is the inverse of the relief pattern of the stamp.

With both processes the contoured surface of the stamp preferably is at least partially the inverse of the contoured surface of the substrate to be (im)printed.

The support layer can be obtainable by mixing a pliable support layer material with a sacrificial material to form an initial support layer; solidifying said initial support layer; and removing the sacrificial material from the initial support layer to form the plurality of pores in the support layer. In this way at least a part of the holes in the support layer are not completely isolated closed off from each other and/or the outside world or comprise interconnection with each other and the outside world.

The filler material may be a different material than the material of the pliable stamp layer. This has the advantage that the filler material may be purposively selected in order to tune certain properties of the patterned stamp as explained herein below.

Alternatively, the filler material is the same material as the material of the pliable stamp layer. This has the advantage that a good adherence between the support layer pore surfaces and the filler material is readily obtained, thereby readily obtaining a patterned stamp with good structural integrity.

The filler material may have a refractive index (for the optical radiation) that is substantially the same as that of the support material. Such can be achieved when the filler material is the same as the support layer material.

The pliable stamp layer and/or the support material can be made of the same material or different materials. Preferably they are made of the same material as then adherence between both layers can be advantages and/or physical properties such as coefficients of thermal expansion (reduced stress in the stamp), refractive index may be substantially matched (advantageous for when a stamp needs optical transparency. The pliable stamp layer and/or the support material can comprise or consist of a rubber material. The rubber material can be a polysiloxane based polymer. It has been found that such polysiloxanes are particularly suitable materials to form a patterned stamp for (im)printing a contoured surface. Preferably the polysiloxane based polymer comprises or consists of polydimethylsiloxane (PDMS) type polymers. Mixtures of materials (multiple different PDMS materials) can be used. The pliable stamp layer and/or the support material can be different. In that case they can still have refractive indices that are substantially the same. Substantially the same refractive index may be advantageous when a stamp needs to be optically transparent, or transparent for radiation that is to be used for curing of a resist to be (im)printed with the stamp.

The filler material can be the same material as the support layer material. Thus, also the filler material preferably comprises or consists of polysiloxane based polymers such as the PDMS type polymers.

The pliable stamp layer can have a first Young's modulus and the support layer has a second Young's modulus, wherein the first Young's modulus is larger than the second Young's modulus. This has the advantage that a stamp is provided that has excellent overall flexibility combined with an increased robustness against deformation of the features on the contoured surface of the stamp.

The materials of the support layer and the filler material can have a refractive index such that the support layer is at least partially transparent for optical radiation. Optical radiation may be radiation that is capable of solidifying a printing ink or imprint resist during the printing action upon stimulation with that radiation. Such radiation may have a wavelength in the visible region, the UV region or both. Preferably such radiation is not absorbed by the support layer.

Also the pliable stamp layer is preferably at least partially transparent for the optical radiation. Hence, with such a stamp one can illuminate the ink or imprint resist through the stamp with minimal disturbance of the illumination radiation.

Alternatively, the support layer is opaque or optical radiation scattering. This can be through choosing a filler material that has a refractive index different from that of the support layer material for the optical radiation. With such a stamp illumination during solidification of an ink or imprint resist may commence with scattered illumination radiation that is more homogenously distributed by the scattering stamp layer as long as absorbance of the radiation is not substantial.

The (im)print stamp can comprise a rigid carrier, that may be bendable, where the rigid carrier is adhered to the support layer. The rigid carrier can give further structural integrity to the stamp and reduce the risk of sampe deformation in the X-Y plane (i.e. the plane of the major stamp surface. Such carrier can e.g. be a thin 0.5 mm to 50 micrometer thick, possibly transparent, glass layer. Other layers such as made of silicon, metal, or plastics can be used also.

The stamp of the invention can be made with a stamp manufacturing method comprising applying a layer (115) of a pliable material precursor over a relief pattern master (50) carrying an inverse relief pattern (52) to form the relief pattern (112) in said layer of pliable material precursor;

solidifying the pliable material precursor to form a pliable stamp layer (120) comprising the relief pattern;

providing an intermediate stamp structure by adhering a porous pliable and/or compressible support layer (130) to the solidified pliable stamp layer;

releasing the intermediate stamp structure from the relief pattern master;

forcing the intermediate stamp structure onto a contoured surface of a substrate with the relief pattern facing the contoured surface;

forming the printing stamp by filling at least part of the pores of the porous pliable support layer with a filler material to reduce the pliability of the support layer; and removing the printing stamp from the contoured surface of the substrate.

This method facilitates the formation of a patterned stamp for (im)printing a contoured surface that accurately conforms to such a contoured surface and that can be manufactured in a high yield due to the fact that the support layer is added to the (im)printing layer, i.e. the pliable stamp layer, prior to the release of the imprinting layer from the master such that the imprinting layer is protected from damage during the release and subsequent handling of the released layer. In particular, the porous nature of the support layer ensures that the intermediate stamp structure can be conformed to a contoured surface because the pores in the pliable support layer, e.g. an elastomeric layer, increase the compressibility of the support layer, such that the intermediate stamp structure can be better conformed to the contoured surface to be (im)printed. By filling the pores with a filler material after conforming the intermediate stamp structure to the contoured surface, the compressibility of the support layer is reduced, i.e. the support layer is 'frozen' into the deformed state conforming with the contoured surface, thereby yielding the patterned stamp for imprinting such contoured surfaces that can be brought into contact with virtually every aspect of the contoured surface.

The method further comprises solidifying (also sometimes referred to as "curing") the filler material in order to immobilize the support layer in the deformed state conforming to the contoured surface. The solidified/cured filler material may be the same material as the material of which the support layer is formed or may be a different material, for instance to tune certain properties of the support layer and patterned stamp such as stamp flexibility. See hereinabove for materials of support layer, filler material and pliable layer material.

The porous pliable support layer may be formed by mixing a pliable material with a sacrificial material to form an initial layer; solidifying said initial layer; and removing the sacrificial material from the initial layer to form the porous pliable support layer. This provides excellent control over the porosity of the porous pliable support layer, as the degree of porosity may be controlled by controlling the ratio between the sacrificial material and the pliable material when forming the initial layer.

For example, the sacrificial material may be a sucrose matrix, wherein the removing step comprises dissolving said sucrose matrix, thereby forming the porous pliable support layer. Other matrices may be used that dissolve in a solvent that does not dissolve the support layer. Hence, many options can be thought of by those skilled in the art.

The intermediate stamp structure may be forced onto the contoured surface in any suitable manner, e.g. by manual or machine pressing. In an embodiment, the step of forcing the intermediate stamp structure onto the contoured surface comprises placing the intermediate stamp structure on the contoured surface in a vacuum chamber; and reducing the pressure in said vacuum chamber to force the pliable stamp layer onto the contoured surface to obtain a particularly well conforming stamp/contoured surface assembly.

The pliable stamp layer and the porous pliable support layer preferably comprise a rubbery material, as such materials help provide the stamp with the desired degree of flexibility and compressibility. Polysiloxane-based materials are particularly suitable, such as polydimethylsiloxane (PDMS) type polymers.

The method may further include fixating the patterned stamp on a rigid carrier on a rigid carrier such as a glass carrier to give further structural integrity to the stamp and reduce the risk of stamp deformation in the X-Y plane (i.e. the plane of the major stamp surface receiving the carrier).

There is also provided the use of the patterned stamp for a printing method or printing process. This can be microcontact printing or imprinting.

The imprint method can be for forming a patterned contoured surface. To this end the method can comprise providing a pattern precursor layer (sometimes also referred to as a printing ink or imprint resist) over a contoured surface; (im)printing the pattern precursor layer with a patterned stamp according one or more embodiments of to the present invention; developing the pattern precursor layer into a pattern layer; and removing the patterned stamp from the solidified pattern layer. This yields a contoured surface with excellent pattern coverage. The substrate surface may be a contoured surface matching the contours of the stamp surface or may be a planar surface.

The imprinting step may be performed under reduced pressure, e.g. vacuum, to further improve the contact between the patterned stamp and the contoured surface.

The printing method can comprise an etch step for removing at least part of the thinner regions of the solidified pattern layer to expose the substrate surface at the removed thinner regions. In this way the solidified pattern layer can be used as an etch mask in a next etch step of the method with which the exposed regions can be etched. Etching can be wet etching or dry etching as known in literature for a variety of substrates and corresponding masks.

In an imprinting method of the invention, the pattern layer precursor preferably is a sol-gel based resist comprising e.g. silicon based sol-gel. However other materials can be used as long as compatible with the stamp layer material, meaning that the pattern layer precursor materials preferably do not deteriorate the stamp material.

BRIEF DESCRIPTION OF THE DRAWINGS

The invention is described in more detail and by way of non-limiting examples with reference to the accompanying schematic drawings not drawn to scale, wherein.

DETAILED DESCRIPTION OF THE EMBODIMENTS

It should be understood that the same reference numerals are used throughout the Figures to indicate the same or similar parts.

Figure 1:
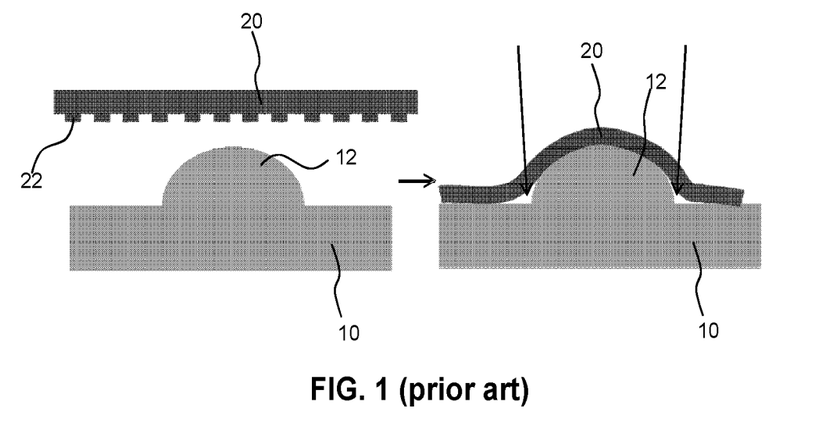
FIG. 1 depicts a prior art imprinting process.

In FIG. 1 a prior art lithographic printing process for printing a surface 10 comprising one or more contours 12 is shown. A rubber stamp 20 such as a PDMS stamp comprising a pattern of features 22 extending from a planar surface of the stamp 20 is brought into contact with the surface 10 comprising one or more contours 12 and coated with an imprintable layer, e.g. an undeveloped resist layer. This layer is not shown in FIG. 1. The stamp 20 is placed on the surface 10 and deformed by exerting pressure on it such that the stamp 20 assumes the overall shape of the surface 10. The resist layer is subsequently developed after which the stamp 20 is removed from the surface 10 to leave behind a developed layer imprinted with the features 22.

However, a problem with this approach is that the planar stamp 20 can only be deformed by a limited amount, such that the boundary between a contour 12 and the remainder of the surface 10 cannot be contacted by the stamp 20, as indicated by the arrows in the right-hand pane of FIG. 1 (the features 22 are omitted in the right-hand pane for the sake of clarity). Consequently, a partially imprinted article is obtained, in which the pattern of features 22 is absent in these boundary regions. The size of the uncovered area can be reduced by increasing the pressure on the stamp 20 during the imprinting process, but this reduces the lifetime of the stamp 20 and increases the risk of deformation of the pattern of features 22 during the imprinting process, which reduces the quality of the transferred pattern on the surface 10.

This problem is addressed by at least some embodiments of the present invention in which a stamp is provided having a patterned surface with an overall shape that complements the surface 10 of the article to be patterned. This has the benefit that the stamp surface does not need to be deformed to be brought into contact with the surface 10 including the boundary region of the contour 12. Consequently, the stamp is capable of transferring its pattern of features to the whole of the surface 10 including the boundary regions of the one or more contours 12 on the surface 10.

Figure 2:
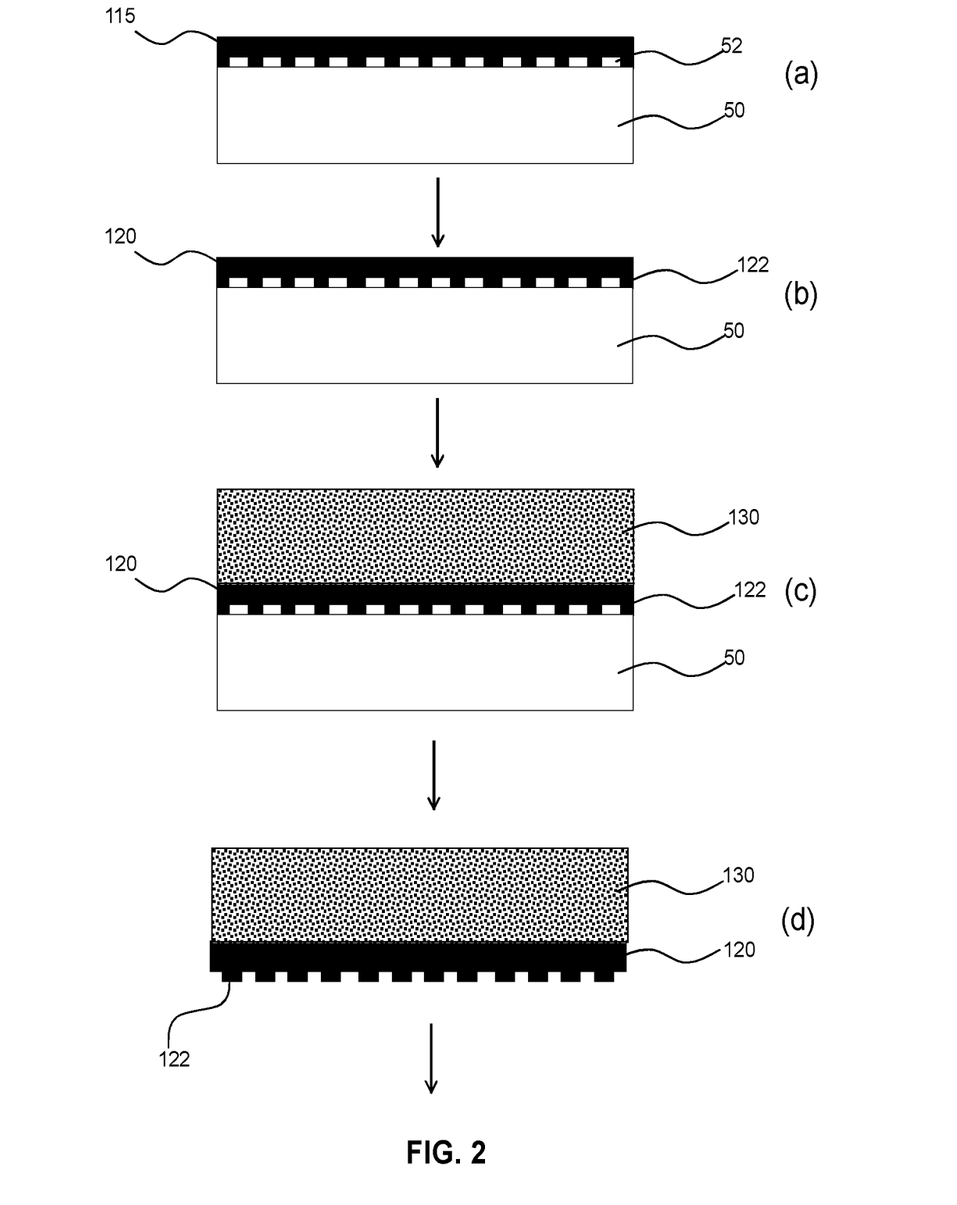
FIG. 2 depicts a stamp manufacturing method according to an embodiment of the present invention.

FIG. 2 schematically depicts the various steps of a method according to an embodiment of the present invention for manufacturing a stamp for use in a soft lithography process, e.g. a nanoscale patterning process of contoured surfaces, as will be explained in more detail later. The method commences in step (a) with the provision of a master mold 50 carrying an inverse or negative pattern 52 of features to be formed in the patterned stamp to be formed by this embodiment. An initial layer 115 of a curable elastomeric material precursor is applied over the master mold 50 such that the negative pattern 52 is immersed by the layer 115. The layer 115 may be applied to the master mold 50 in any suitable manner, e.g. spin coating, dip coating, casting, ink jet printing and so on.

In an embodiment, the initial layer 115 is made of the one or more precursors of an elastomer or rubber-like material, such as a suitable block-copolymer, e.g. SEBS, or a polysiloxane-based rubber-like material, which initial layer 115 is cured in step (b) to form a stamp layer 120 of the elastomer or rubber-like material including the desirable pattern of features 122, i.e. the negative of the pattern 52. The precursor may be an uncured, i.e. non-cross linked, elastomer, which is converted into the stamp layer 120 by curing, i.e. cross-linking.

In an embodiment, the stamp layer 120 is made of a polysiloxane-based rubber-like material such as PDMS. A suitable PDMS type is, so called X-PDMS, a T-branched and/or a Q-branched polysiloxane-based rubber-like material as for instance disclosed in WO2009/147602 A2. It is noted for the avoidance of doubt that a T-branched polysiloxane comprises 3-way branching chains, i.e. networks, for instance when crosslinked by linear polysiloxanes. Likewise, a Q-branched polysiloxane comprises 4-way branching chains, i.e. networks, for instance when crosslinked by linear polysiloxanes. In yet another embodiment the stamp layer 120 is made of PDMS. It should however be understood that the stamp layer 120 may be made of any suitably pliable material.

The pliable stamp layer 120 may have a thickness of no more than a few mm, e.g. 1 mm or less to ensure that the stamp layer 120 has the desired pliability characteristics. In an embodiment, the pliable stamp layer 120 may be made of a rubbery material such as PDMS and/or may have a maximum thickness in the range of 100-1,000 micron, although it should be understood that the lower limit of this range may be further reduced, e.g. to 50 micron, 10 micron or even 1 micron at the cost of increased fragility of the pliable stamp layer 120. For the avoidance of doubt it is clarified that the thickness of the pliable stamp layer 120 is defined as the combination of the thickness of its bulk material and the height of the features 122.

The features 122 define a pattern to be transferred to a surface 10 comprising at least one contour 12. The features 122 may have a feature size ranging from several microns to a few nanometers, i.e. the features 122 may define a nanopattern, although it is also feasible to use larger feature sizes. The pliable stamp layer 120 may have a Young's modulus that is tailored to the intended sizes of the features 122 of the stamp to be manufactured. For instance, for relatively large feature sizes, e.g. feature sizes of 500 nm up to several microns, e.g. 2 micron or 5 micron, a relatively soft rubbery material may be used, e.g. a rubbery material having a Young's modulus in the range of 2.5-5 MPa, such as a soft PDMS. This is because the relatively large sized features 122 are relatively insensitive to collapse due to surface tension during the stamp manufacturing process or an imprinting process. Such collapse is typically related to the inter-feature distance, with small inter-feature distances causing overly flexible features 122 to stick together. It is noted that the inter-feature distance is typically but not necessarily correlated to the feature size.

Hence, when smaller sizes of the features 122 (and/or smaller inter-feature distances) are required, more rigid rubbery materials may be contemplated to prevent collapse of the smaller size features 122 due to the aforementioned surface tension. In an embodiment where the dimensions of the stamp features 122 are in the range of 200 nm-2 micron, a rubbery material having a Young's modulus in the range of 7-11 MPa, such as a hard PDMS may be contemplated, whereas for a stamp having dimensions of the stamp features 122 in the range of 1 nm-2 micron, a rubbery material having a Young's modulus in the range of 40-80 MPa, such as an extra hard PDMS (sometimes referred to as X-PDMS) may be contemplated. For the avoidance of doubt it is noted that the reported Young's moduli have been determined by a standardized hardness test according to the ASTM D1415-06(2012) standard by penetrating the rubber material with a rigid ball under the conditions mandated by the standard. However, other methods can be used as long as the same method is used for determining the moduli of both layers as otherwise comparison would be more difficult or somewhat less accurate.

As explained above, the stamp layer 120 may be fragile due to its relative thinness such that the release of the stamp layer 120 from the master mold 50 can cause the fragile stamp layer 120 to become damaged. Even if the stamp layer 120 is released unscathed from the master mold 50, damage may occur during subsequent handling of the stamp layer 120, e.g. in a subsequent transfer of the stamp layer 120 to a contoured master surface in order to conform the shape of the stamp layer to such a master surface as will be explained in more detail below. Therefore, although a thin stamp layer 120 can be easily conformed to a contoured master surface, stamp manufacturing methods in which such a thin stamp layer 120 is transformed to a contoured master surface tend to suffer from poor yields due to a large number of thin stamp layers 120 getting damaged during or after release of the stamp layer 120 from the master mold 50.

The yield of such a manufacturing process can be increased by increasing the thickness of the stamp layer 120 on the master mold 50, but this typically compromises the flexibility of the stamp layer 120, which may lead to the stamp layer 120 conforming less well to a contoured master surface.

This particular problem has been addressed as shown in step (c), in which a porous elastomer layer 130 is adhered to the stamp layer 120, such as a porous polysiloxane layer in order to form an intermediate stamp structure. PDMS is a particularly suitable candidate material for such a porous elastomer layer 130. As explained above, increasing the thickness of the stamp layer 120, e.g. by the addition of a solid support layer on the stamp layer, reduces the ability of the stamping layer 120 to conform to a master contoured surface in a satisfactory manner due to the fact that such a solid support layer, i.e. a non-porous support layer, typically is deformable only, such that either some of the features 122 are not brought into contact with the contoured master surface or that the pressure required to bring all features 122 into contact with the contoured master surface causes at least some of these features 122 to deform, e.g. buckle.

In contrast, when using a porous elastomer such as a porous polysiloxane, e.g. PDMS, as the support layer 130, it has been found that the support layer 130 is pliable (compressible) such that less force is required to confirm the stamp layer 120 including features 122 to the contoured master surface in a satisfactory manner. Consequently, the intermediate stamp structure can be easily released from the master mold 50 without damaging the stamp layer 120 whilst at the same time facilitating excellent conformity of the stamp layer 120 to the contoured master surface, as will be explained in more detail below.

Such a pliable porous (elastomeric) support layer 130 for instance may be formed by mixing the precursor(s) of the elastomer with a sacrificial material, curing the elastomer precursor(s) to form a layer comprising the elastomer incorporating a matrix of the sacrificial material and removing the sacrificial material to form the porous pliable support layer 130. As explained before, in some embodiments the elastomer precursor may be the elastomer before cross-linking. In the context of a present application, a sacrificial material is a material that may be selectively removed from the elastomer layer, e.g. using thermal decomposition, dissolving the sacrificial material in a suitable solvent that does not dissolve the elastomer, and so on.

The precursor material preferably is a composition for forming a rubber-like support layer on the pliable stamp layer 120. The rubber-like support layer preferably has similar or identical thermal expansion coefficients as the pliable stamp layer 120. This may for instance be achieved by the pliable stamp layer 120 and the rubber-like support layer having the same material composition.

In an embodiment, the precursor material for forming the porous support layer 130 is a composition for forming a PDMS having a Young's modulus of 2.5-5 MPa, i.e. a soft PDMS. The soft PDMS rubber-like support layer may be combined with any of the aforementioned PDMS pliable stamp layers 120, i.e. with a PDMS pliable stamp layer 120 having the same or a higher Young's modulus.

In the context of the present invention, 'mixing' the precursor(s) of the elastomer with a sacrificial material may include any process in which the sacrificial material is incorporated within the elastomer precursor layer. For instance, in case the sacrificial material is a thermally degradable polymer material, a blend of the elastomer precursor(s) and a sacrificial material may be made, which blend may be cast, spin coated, dip coated, inkjet printed or otherwise formed into the elastomer precursor layer including the sacrificial material, after which the elastomer precursor layer may be cured and the sacrificial material may be released from this cured layer by heating as will be readily understood by the skilled person.

As an alternative example, a matrix of the sacrificial material may be made, onto which the elastomer precursor(s) is deposited to form the elastomer precursor layer. For instance, a sucrose matrix may be formed by mixing water and sugar (sucrose) and placing the mix in a pre-form or mold. By drying the mix, i.e. removing the water therefrom, a sucrose matrix is obtained. This matrix may be shaped, e.g. polished, in order to obtain a smooth sacrificial matrix.

A fluid elastomer precursor such as a non-cured polysiloxane, e.g. PDMS, may be deposited over the thus obtained sacrificial matrix such that the matrix is filled with this precursor material, after which this material may be cured. The precursor material may be solidified to form the rubber-like porous support layer 130. The solidification process may for instance be achieved by a curing process catalyzed by optical radiation such as UV radiation, heat, radicals and combinations thereof.

When depositing the fluid elastomer precursor, at least one surface of the sacrificial matrix preferably remains exposed to facilitate the release of the sacrificial material from the cured elastomer. In the non-limiting example of a sucrose matrix, the matrix may be removed from the elastomer layer by dissolving the matrix material in water, thereby yielding the porous pliable support layer 130.

The pore size and density of the porous pliable support layer 130 may be controlled by the ratio of sacrificial material to elastomer precursor and/or by controlling the openness of the sacrificial matrix. For instance, in the water/sucrose example, the openness of the matrix may be controlled by controlling the ratio of water/sucrose. Particular suitable ratios range from 1:10 to 1:100 by weight, with the higher ratio causing a more dense sucrose matrix, thus leading to smaller pores in the porous pliable support layer 130. It is reiterated that sucrose is mentioned as a non-limiting example only and that other compounds, e.g. other sugars or other water-soluble compounds, may be used to form such a water-soluble matrix. Moreover, it is not necessary that the matrix is water-soluble; any solvent for dissolving the matrix in which the elastomer of the porous pliable support layer 130 does not dissolve may be used, such that any compound capable of forming such a matrix and being dissolvable in the chosen solvent may be contemplated.

The thus obtained porous pliable support layer 130 may be adhered to the stamp layer 120 in any suitable manner in order to form the intermediate stamp structure, e.g. using a suitable glue or amine/epoxy chemistry as for instance disclosed in Langmuir, 25(6), 2009, 25, 3861-3866. For example, for a PDMS stamp layer 120 and a porous PDMS support layer 130, uncured PDMS may be used as a glue between these layers and subsequently cured to achieve the required adhesion between these layers. It is emphasized that this is merely a non-limiting example and that it will be immediately apparent to the skilled person that any suitable glue in between these layers may be used.

The method subsequently proceeds to step (d) in which the intermediate stamp structure is released from the master mold 50. As previously explained, due to the presence of the porous pliable support layer 130, the stamp layer 120 including features 122 is protected from accidental damage during the release and subsequent transfer process by the porous pliable support layer 130.

In step (e), the intermediate stamp structure is impressed upon the contoured master surface 10, which master surface has the shape and dimensions of the contoured surfaces to be imprinted by the patterned stamp to be formed. In an embodiment, the contoured surface 10 has a length ranging from a few microns to several cm. The stamp layer 120 may have a length matching the length of the contoured surface 120. The contoured surface 10 may be of any suitable material, e.g. glass, a suitable polymer, a metal, a semiconductor material such as Si, SiGe, AlGaN, and so on. The contoured surface 10 may form part of an article to be mass-produced, such that multiple copies or instances of the contoured surface 10 are to be imprinted. The contoured surface 10 as shown in FIG. 2 acts as a template for these multiple copies or instances of the contoured surface 10. In the context of the present location, a contoured surface 10 is a surface comprising at least one contour, e.g. at least one protrusion extending or one depression receding from a main surface. Such protursions or depressions can be pyramids with one or more straight or curved surfaces. The main surface may also be continuously curved (e.g. a half sphere or cylinder or other rounded protrusions or depressions).

In step (e), the intermediate stamp structure is applied over the contoured surface 10 such that the pattern of features 122 is brought into contact with the contoured surface 10. Due to the porous nature of the support layer 130, which imparts an enhanced compressibility onto the support layer 130 as previously explained, the pliable stamp layer 120 can be brought into contact with the entire surface of the contoured surface 10, including the boundary region of the contours 12, i.e. the region in which the contoured surface 10 may comprise a discontinuity. In an embodiment, the intermediate stamp structure is applied over the contoured surface 10 under reduced pressure, as this further improves the intimate relationship between the features 122 and the contoured surface 10. The removal of the air or other gas from between the pliable stamp layer 120 and the contoured surface 10 ensures that the pliable stamp layer 120 adheres to the contoured surface 10, in particular in the aforementioned discontinuous surface regions of the contoured surface 10. Such a reduced pressure may for instance be achieved by placement of the contoured surface 10 and applied intermediate stamp structure in a vacuum chamber and applying a vacuum to the contoured surface 10 and applied pliable stamp layer 120.

As previously mentioned, the pattern of features 122 may deform during the application of a pliable stamp layer 120 on the contoured surface 10, e.g. when molding or stretching the pliable stamp layer 120 over the contoured surface 10 and/or when a relatively large pressure, e.g. vacuum pressure, is applied to the pliable stamp layer 120. Such deformations may typically occur when voids are present in between the features 122, as the (reduced) pressure will remove the medium, e.g. air, from these voids, which can lead to the deformation of the features 122.

In an embodiment, this problem is addressed in that pliable stamp layer 120 comprises a distorted pattern of features 122 such that during the application step (b) in which the patterned pliable stamp layer 120 is forced onto the contoured surface 10, the distorted pattern of features 122 deforms into the intended or desired pattern of features 122. The distorted pattern of features 122 may be empirically determined or may be calculated, e.g. using modelling software that can estimate the deformation of such features 122 under the applied pressures.

In an alternative embodiment, this problem is addressed by applying a soft layer such as an undeveloped resist precursor layer or another suitable liquid layer, e.g. an uncured material composition, onto the contoured surface 10, such that the features 122 are pressed into this soft layer during application step (b). More specifically, the medium in the voids in between the features 122 is replaced by the soft layer material, e.g. the resist material, such that the soft layer material in these voids provides structural support to the features 122, thereby preventing significant distortion of the features 122. This therefore may obviate the need to provide the patterned pliable stamp layer 120 with a distorted pattern of features 122 as the pattern does not significantly deform during the application step (b). As such, this embodiment may provide a more cost-effective solution to the deformation problem.

The method subsequently proceeds to step (f) in which the pores of the porous pliable support layer 130 are filled with a filler material to obtain the filled support layer 140. As the pores of the support layer 130 impart the enhanced compressibility on this layer, filling these pores reduces the compressibility of the filled support layer 140 and fixates or 'freezes' the intermediate stamp structure into the shape of the contoured surface 10, thereby forming the patterned stamp 100. This ensures that the patterned stamp 100 retains the shape of the contoured surface 10 upon release from this surface. The filler material may be an elastomer or elastomer precursor, that may be cured after filling the porous pliable support layer 130 in order to solidify the filler material and give the filled support layer 140 its desired rigidity.

For the sake of structural integrity, the (cured) filler material may have the same composition as the material used for the elastomer support layer 130, as this ensures that the filler material adheres well to the walls of the pores in the elastomer support layer 130 when forming the filled support layer 140.

However, in an alternative embodiment, the filler material is a different material than the material of the pliable porous stamp layer 130. This for instance facilitates the provision of a very soft, i.e. compressible, pliable porous stamp layer 130 that is filled with a harder, i.e. more rigid filler material, such that the intermediate stamp structure facilitates excellent conformity to the contoured master surface 10 whilst the filled support layer 140 exhibits excellent shape retention properties due to the more rigid filler material in the pores of the material of the pliable porous stamp layer 130, e.g. a soft porous PDMS layer filled with a hard PDMS filler material. Other suitable filler materials include elastomers such as silicon rubbers and polyurethane rubbers. Further suitable materials will be apparent to the skilled person.

Upon filling the porous pliable support layer 130 with the filler material to form the rigid (shape-retaining) support layer 140, a rigid carrier 160 may optionally be formed on the support layer 140, as shown in optional step (f). Such a rigid carrier 160 may be made of any suitable rigid material, e.g. glass, polycarbonates, PMMA. Even metals could be used. The rigid carrier 160 preferably is made of a material that is thermally matched to the material of a substrate to be patterned by the stamp, i.e. has similar or identical thermal expansion coefficients therewith, such that changes in temperature during the imprinting process do not affect the alignment of the stamp with the surface receiving its pattern. The rigid support layer 140 may be affixed to the rigid carrier 160 in any suitable manner, e.g. through grafting or through adhesion using an adhesive.

The resultant structure may subsequently be released from the contoured surface 10 to yield a patterned stamp 100 having a stamp layer 120 comprising a stamp surface carrying a pattern of features 122, which stamp surface matches the surface profile of the contoured surface 10, wherein the structural integrity of the stamp 100 is provided by the support layer 140 and optionally by the rigid carrier 160. This is shown in step (h). In other words, the contoured stamp layer 120 comprises a stamp surface that is the inverse of the patterned contoured surface to be formed.

In an embodiment, the patterned stamp 100 has an elastomeric or rubber body including stamp layer 120 that is made of the same material as the filled support layer 140, e.g. soft PDMS. In an alternative embodiment, the patterned stamp 100 has a stamp layer 120 that is made of a different material than the support layer 140, e.g. a soft PDMS support layer 140 and a hard PDMS or X-PDMS stamp layer 120 as previously explained. In yet another embodiment, the patterned stamp 100 has an elastomeric or rubber body including stamp layer 120 that is made of the same material as the porous support layer 130, e.g. soft PDMS, wherein the porous support layer 130 is filled with a different filler material as previously explained. In yet another embodiment, the stamp layer 120, the porous support layer 130 and the filler material are all different materials.

More generally, the patterned stamp 100 may have an elastomeric or rubber body including a stamp layer 120 of an elastomeric or rubbery material having the same or a higher Young's modulus as the elastomeric or rubbery material of the filled support layer 140, as previously explained. It should be understood that it is desirable to use a material for the pliable stamp layer 120 with a Young's modulus that is as low as possible, but still sufficiently high to prevent relief feature pattern collapse, to ensure an easy release of the patterned stamp 100 from a layer imprinted by the patterned stamp 100 to maximize the lifetime of the patterned stamp 100.

It is noted for the avoidance of doubt that embodiments of the present invention are directed to any patterned stamp 100 that has a contoured printing surface carrying a pattern of features 122, and that is obtainable by embodiments of the stamp manufacturing method of the present invention.

The patterned stamp 100 may be used in imprinting processes such as soft lithography imprinting processes in which an ink, e.g. a resist layer, on a surface to be patterned is imprinted with a patterned stamp to transfer the stamp pattern into the ink or resist layer. This allows for the formation of patterns having nanoscale feature sizes on such surfaces, as is known per se.

Figure 3:
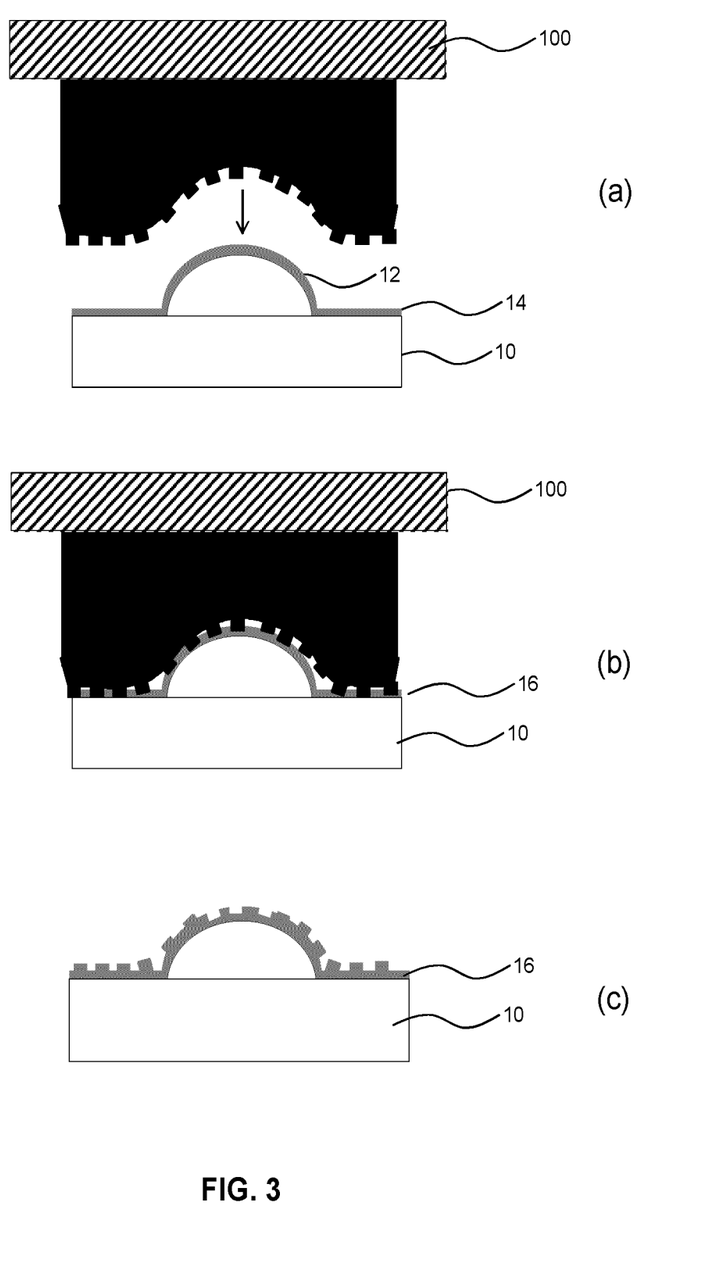
FIG. 3 depicts an imprinting method according to an embodiment of the present invention.

An example embodiment of an imprinting method in accordance with the present invention is shown in FIG. 3. In step (a), a receiving surface 10 comprising one or more contours 12 is provided together with an embodiment of the patterned stamp 100 of the present invention. An ink or resist precursor layer 14 to be imprinted by the patterned stamp 100 is provided on the contoured surface 10. The ink or resist precursor layer 14 may be any suitable material, e.g. an organic or inorganic resist precursor material. As such materials are well-known per se and widely documented, a further description of the compositions of such materials is omitted for the sake of brevity only. Similarly, the material used for the contoured surface 10 is not particularly limited. Any suitable material may be used for the contoured surface as previously explained. It is noted that the contoured surface 10 to be imprinted shown in FIG. 3 is identical to the contoured master surface 10 shown in FIG. 2 to form the patterned stamp 100, thereby ensuring that the contoured surface of the patterned stamp 100 precisely matches the shape of the contoured surface 10 upon correct alignment, including the boundary regions of the contours 12 as previously explained in more detail.

In step (b), the ink or resist layer 14 is imprinted with the patterned stamp 100 and subsequently developed, e.g. solidified through a curing reaction, to form the patterned ink or resist layer 16 on the contoured surface 10, after which the patterned stamp 100 is removed in step (c) to yield an article comprising a contoured surface 10 carrying a patterned ink or resist layer 16. As previously explained, such an article benefits from the fact the pattern on the contoured surface 10 is continuous, i.e. also present in the boundary regions of the contours 12, thus providing a contoured surface pattern of high quality.

Figure 4:
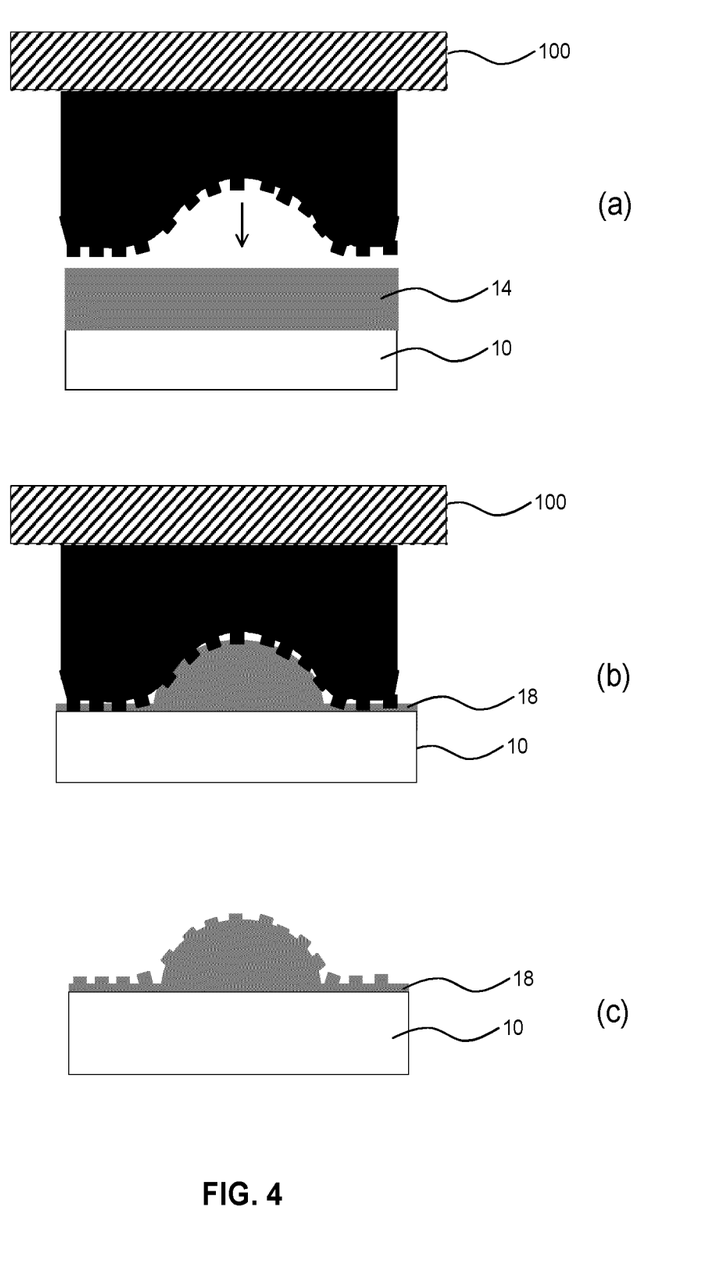
FIG. 4 depicts an imprinting method according to another embodiment of the present invention.

At this point it is noted that the imprinting method of the present invention is not limited to imprinting contoured surfaces only. An alternative embodiment is shown in FIG. 4, in which the patterned stamp 100 is used to form contours on a planar receiving surface 10. To this end, a relatively thick (viscous) ink or resist precursor layer 14 is applied on the surface 10 in step (a), after which the ink or resist precursor layer 14 is imprinted with the patterned stamp 100 and subsequently developed in step (b) to yield a patterned ink or resist layer 18 after removal of the patterned stamp 100 in step (c). The patterned ink or resist layer 18 includes the contours 12 shown in FIGS. 2 and 3, i.e. the contours 12 do not form an integral part of the substrate comprising the planar surface 10 but instead are formed as part of the developed patterned ink or resist layer 18.

It is noted that the contours 12 forming part of the developed patterned ink or resist layer 18 are more susceptible to shrinkage than when the contours 12 form an integral part of the contoured surface 10. Also, it will be apparent that more ink or resist material 14 is required in the method of FIG. 4. However, in the imprinting method of FIG. 3, the patterned stamp 100 must be carefully aligned with the contoured surface 10 to achieve a high-quality transfer of the pattern of features 122 to the contoured surface 10, whereas in the method of FIG. 4 such alignment requirements are much more relaxed since the contoured surface of the patterned stamp 100 does not match the shape of the planar surface 10.

At this point, it is noted that the imprinting steps (b) in FIGS. 3 and 4 may be performed under reduced pressure, e.g. in a vacuum chamber to further improve the contact between the patterned stamp 100 and the (contoured) surface 10.

The method as shown in FIG. 3, i.e. the formation of the feature pattern on an already contoured surface may be useful if the contours have relatively large dimensions, e.g. dimensions of 100 microns to several centimetres and beyond. The method shown in FIG. 4 may be less suitable to form patterned contoured surfaces with such dimensions as the amount of shrinkage of the contours 12 formed from the resist material 18 may prohibit the accurate reproduction of the desired contoured surface 10. However, for smaller contour sizes, e.g. contour sizes in the range of 1-100 micron, the method shown in FIG. 4 can be used to accurately reproduce the desired contoured surfaces because of the modest amount of shrinkage of the contours 12 formed from the resist material 18.

At this point, it is noted that the size of the contours in the printing surface of patterned stamp 100 is not particularly limited. The contours may have dimensions ranging from about 1 micron to dimensions in the centimetre range, e.g. 1 cm or beyond. Moreover, the ratio defined by the dimensions of the contours in the printing surface of patterned stamp 100 divided by the dimensions of the features 122 is not particularly limited and may range from as little as 2 to as much as 1,000,000,000, e.g. from 5-100,000,000 or from 50-50,000,000. In other words, nanometer-sized features may be imprinted onto contoured surfaces having contour dimensions of several centimetres up to a metre.

Figure 5:
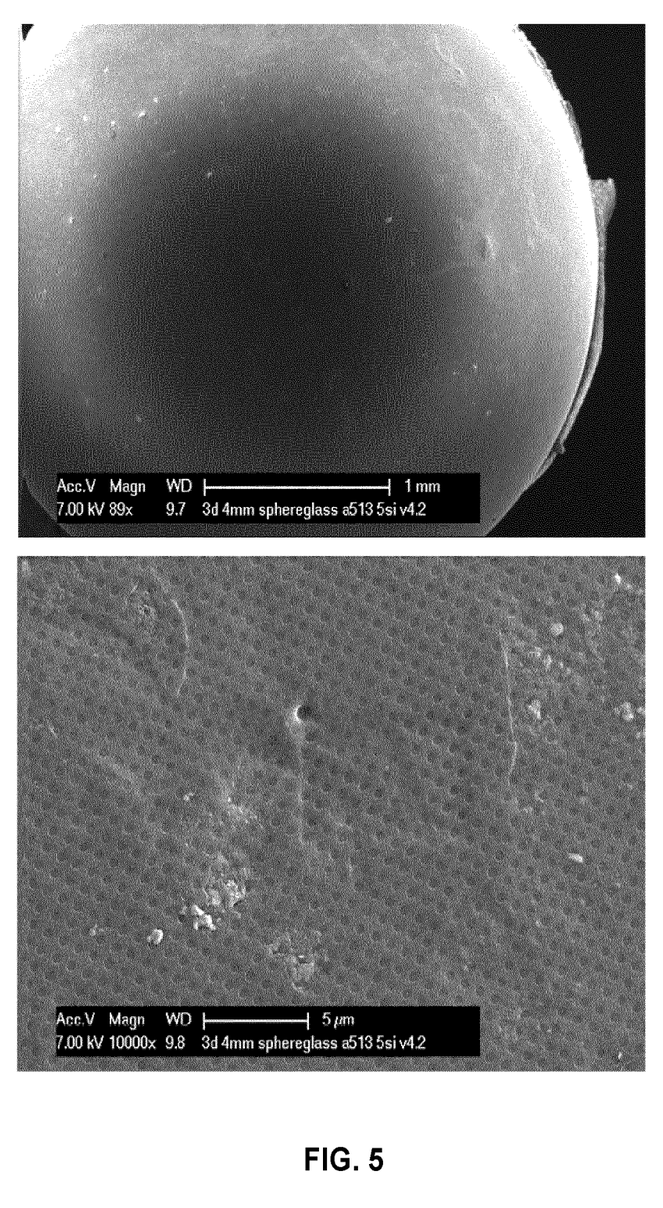
FIG. 5 shows SEM photos of an article imprinted in accordance with the imprinting method of FIG. 3.

FIG. 5 shows a pair of SEM images of a glass sphere having a 4 mm diameter that has been imprinted in accordance with the imprinting method of FIG. 3 using a patterned stamp 100 formed in accordance with the method shown in FIG. 2, in which an identical glass sphere was used as the contoured surface 10. The top image shows the resultant structure at 89× magnification and the bottom image shows the resultant structure at 10,000× magnification. It can be readily recognized in FIG. 5 that a regular pattern has been produced on the glass sphere with negligible defects. The debris that can be recognized on the glass sphere in the bottom image is contamination of the patterned surface of the glass sphere that is unrelated to the imprinting method.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A printing stamp for imprint lithography, comprising:
a pliable stamp layer, wherein the pliable stamp layer has a contoured surface carrying a relief pattern; and
a support layer,
wherein the support layer is connected to the pliable stamp layer,
wherein the support layer comprises a plurality of pores,
wherein the plurality of pores are filled with a filler material.

2. The imprint stamp of claim 1, wherein the filler material is a different material than the material of the pliable stamp layer.

3. The imprint stamp of claim 1, wherein the filler material is the same material as the material of the pliable stamp layer.

4. The imprint stamp of claim 1, wherein at least one of the pliable stamp layer and the support layer comprises a siloxane based polymer.

5. The imprint stamp of claim 1,
wherein the pliable stamp layer has a first Young's modulus,
wherein the support layer has a second Young's modulus,
wherein the first Young's modulus is larger than the second Young's modulus.

6. The imprint stamp of claim 1,
wherein the material of the support layer and the filler material have a refractive index,
wherein the refractive index is arranged such that the support layer is at least partially transparent for optical radiation.

* * * * *